United States Patent [15] 3,660,666

Hendrickson [45] May 2, 1972

[54] RADIATION SENSITIVE ELECTRONIC TIME DELAY SWITCH

[72] Inventor: Alvin E. Hendrickson, Chula Vista, Calif.

[73] Assignee: Hadrian J. Liberatore, San Diego, Calif.

[22] Filed: May 18, 1970

[21] Appl. No.: 38,259

[52] U.S. Cl. ..............................250/206, 250/214, 307/293, 307/252 J

[51] Int. Cl. ..........................................................H01j 39/12

[58] Field of Search ..........................250/206, 214; 315/159; 307/311, 293, 252 J

[56] References Cited

UNITED STATES PATENTS

| | | | |
|---|---|---|---|
| 3,347,141 | 10/1967 | Nobusawa et al. | 250/206 X |
| 3,297,910 | 1/1967 | Gershen | 250/206 X |
| 3,343,043 | 9/1967 | Ito et al. | 250/206 X |
| 3,345,536 | 10/1967 | Atkins et al. | 250/214 D |
| 3,421,008 | 1/1969 | Shaw | 250/214 |
| 3,552,862 | 1/1971 | Weinberg | 307/311 X |

*Primary Examiner*—Walter Stolwein
*Attorney*—Carl R. Brown

[57] ABSTRACT

The charge rate of a charging capacitor is controlled by the resistance of a photocell that is in turn controlled by the flashing rate of a flashing light, and the charge level of the charge capacitor energizes a uni-directional device that biases an SCR device to the ON condition closing a DC power circuit. The flashing rate of the flashing lamp is adjustable to establish a charge rate of the charge capacitor.

6 Claims, 1 Drawing Figure

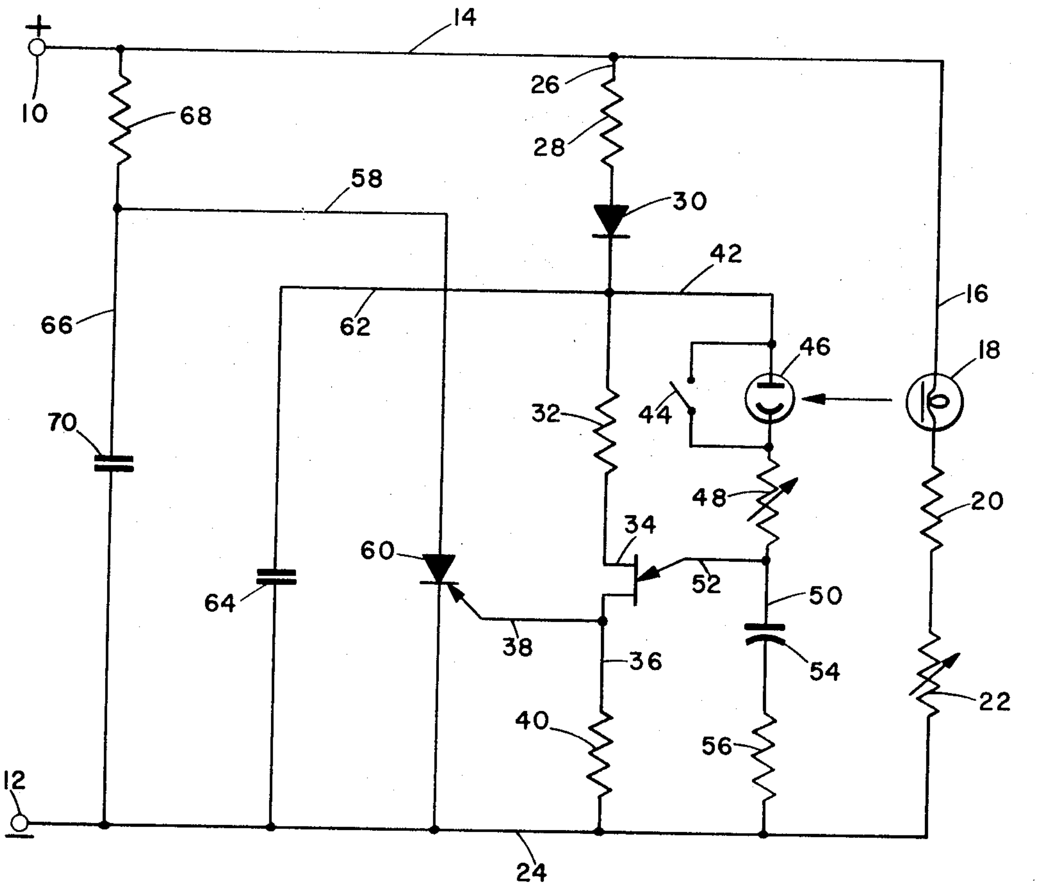
INVENTOR.
ALVIN E. HENDRICKSON
BY
Carl R. Brown
ATTORNEY

RADIATION SENSITIVE ELECTRONIC TIME DELAY SWITCH

BACKGROUND OF THE INVENTION

There are many different types of electrical time delay switches. These time delay switches are used in many applications and in many different types of circuits. One use for such time delay switches is in low voltage and large ampere power circuits such as in vehicles, automobiles and the like. In such circuits, it is often desirable to connect the time delay switch in series with the DC power circuit. This requires that the time delay circuit be capable of handling the load current in the circuit during the time delay period, providing maximum power transfer at the end of the time delay period. While there are known time delay switches that are capable of operating in this environment, these switches normally have moving parts with relay or switch contacts. Because such contacts are often required to handle the switching of maximum power through the delay switch circuit, such contacts are exposed to arcing and the like that limits the life of the time delay switch.

Thus it is advantageous to have a new and improved electronically operable time delay switch that has a minimum of moving parts and that is capable of switching maximum DC power through a circuit connected in series with a power line.

SUMMARY OF THE INVENTION

In an exemplary embodiment of the electronic time delay switch, an SCR device is connected in series with the power circuit. The SCR device is in parallel with a charged capacitor circuit and with a uni-directional device. Upon applying power to the time delay switch, the capacitor circuit charges to a given level in a given time interval, at which level the uni-directional device fires biasing the SCR device to the ON condition and closing the maximum power transfer path through the time delay switch in the DC power line.

In one embodiment, the charging capacitor is charged directly from the input power line. In another embodiment, the charged capacitor circuit is charged through a photoconductor in the input charge line. The photoconductor is selectively illuminated by a flashing lamp that controls the resistance of the photoconductor at the rate of flashing light illuminating the photoconductor. The resistance of the photoconductor in turn sets the charge rate or charge time of the capacitor in the charge capacitor circuit. The flashing lamp is also connected in parallel with the power circuit and has a potentiometer or the like that selectively sets the flashing rate of the flashing lamp. The potentiometer in the flashing lamp circuit and a second potentiometer in the capacitor charging circuit provides coarse and fine adjustment of the time delay of the electronic time delay switch.

It is therefore an object of this invention to provide a new and improved electronic time delay switch.

Other objects and many advantages of this invention will become more apparent upon a reading of the following detailed description and an examination of the drawing wherein like reference numerals designate like parts throughout.

The single FIGURE in the drawing is a schematic illustration of the embodiment of the invention.

Referring to the drawing, connecting contacts 10 and 12 are connected in series with a DC power line (not shown) that may comprise a battery power circuit in a vehicle, automobile or the like that would have, for example, a 12-volt DC power supply. When the DC power is applied across connecting contacts 10 and 12, the current passes into lines 58 and 66 through load resistor 68. Current also passes through line 14 and lines 26, 42 and 62 through the current limiting resistor 28 and the uni-directional device 30. Current also passes from line 14 into line 16. Since capacitors 64 and 70 prevent DC current passage therethrough, and SCR device 60 is de-energized as is uni-directional device 34, and the photocathode of photocell 46 is non-illuminated and thus is at its maximum resistance; the current flow is through line 16, through flashing lamp 18, current limiting resistor 20, the adjustable resistor or potentiometer 22 and line 24 to the output contact 12. In this condition, the magnitude of current flow from input 10 to output 12 is so small as to be substantially negligible.

This current flow through flashing lamp 18 causes the flashing lamp 18 to flash at a given time rate, which flashing illuminates the photoconductor of photocell 46 that assumes a given resistance depending upon the degree of illumination. The resistance of photocell 46, thus being reduced, passes current from line 42 through variable resistance 48 to the charging capacitor 54. As the charging capacitor 54 charges to a given level, which given level is determined by the biasing voltage on line 52 required to energize uni-directional device 34, then at the given level the uni-directional device 34 is energized. When uni-directional device 34 is energized, it provides substantially a short circuit between the biasing resistor 32 and limiting resistor 40, which biases the biasing line 38 of the SCR device 60, closing the SCR 60. This applies a circuit across input contacts 10 and 12 through the load resistor 68, thus closing the DC power circuit.

It may thus be seen, that the flashing rate of the flashing lamp 18 determines the time delay of the closing of the time delay switch. Variable resistor or potentiometer 22 selectively sets the current flow through the flashing lamp 18, that may comprise known flashing lamp made by General Electric Company or other suitable flashing lamps. The flashing lamp 18 may, for example, comprise a lamp circuit with bi-metal strips that continuously open and close. In such a lamp, the given flash rate may be in the order of one flash per second with a flash duration of approximately one-half second. Variable resistor or potentiometer 48 in turn controls the charge rate of capacitor 54 and thus the time delay of the time delay switch.

In operation, switch 44 is open and DC power is applied at contacts 10 and 12. This electrical power energizes the flashing lamp 18 that reduces the resistance of photocell 46 and allows charging of the capacitor 54. When capacitor 54 is charged to a given level, the time required being determined by the setting of potentiometer 48 and the setting of potentiometer 22, then the uni-directional device 34 is biased through line 52 to the ON condition that in turn closes line 36 to the input power line 14 that biases the SCR device 60 to the ON condition. Once the SCR device 60 is biased to the ON condition, it remains on until such time as power is removed from the input power contacts 10 and 12. Capacitors 64 and 70 function to suppress transits such as spike voltages and the like. The uni-directional device may have a narrow band voltage sensitivity for example, 6.299 volts. Through adjustment of potentiometers 22 and 48, a very high and critically controlled timing of the time delay is possible.

In another embodiment of the invention, switch 44 may be closed, short circuiting the photocell 46 and charging the capacitor 54 directly from the input line 14. This provides a fixed rate of time delay.

Thus it may be seen that the entire electronic time delay switch functions to control the direct current power flow through a power circuit after power is applied to the circuit, by an electronic time delay switch that is connected in series with the power circuit.

Having described my invention, I now claim:

1. An electronic time delay switch for closing a direct current electrical power circuit at a time subsequent to the time power is applied to said circuit comprising,
   - an SCR device in series with the power circuit,
   - a charge capacitor circuit having a charge capacitor,
   - flasher light means energized by power being applied to the power circuit for flashing light at a given time rate,
   - photoconductor means connected to said charge capacitor circuit and being illuminated by said flasher light means for conducting current to said charge capacitor at a charge rate proportioned to the time rate of the flashing light, and a uni-directional means for detecting a given level in said charge capacitor circuit for biasing said SCR device to the conducting condition.

2. An electronic time delay switch as claimed in claim 1 including, means for selectively adjusting the flashing rate of said flashing light.

3. An electronic time delay switch as claimed in claim 2 including, means in said charge capacitor circuit for adjusting the charge rate of said capacitor.

4. An electronic time delay switch as claimed in claim 1, in which, said flasher light means and said charge capacitor circuit, said SCR device and said uni-directional device are connected in parallel, and biasing means for said uni-directional device connected to the electrical connection between said flasher light means and said charge capacitor.

5. An electronic time delay switch as claimed in claim 4 including, a potentiometer connected in the electrical circuit between the connection of the biasing means for said uni-directional device and said photoconductor means.

6. An electronic time delay switch as claimed in claim 5 including, a potentiometer connected in series with said flashing light for being selectively adjusted to adjust the flashing rate of said flashing light.

* * * * *